United States Patent
Wang

(10) Patent No.: US 11,359,106 B2
(45) Date of Patent: Jun. 14, 2022

(54) INKJET PRINTING INK AND APPLICATION THEREOF

(71) Applicant: Shenzhen China Star Optoelectronics Semiconductor Display Technology Co., Ltd., Guangdong (CN)

(72) Inventor: Shipan Wang, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 393 days.

(21) Appl. No.: 16/620,876

(22) PCT Filed: Nov. 6, 2019

(86) PCT No.: PCT/CN2019/115842
§ 371 (c)(1),
(2) Date: Dec. 10, 2019

(87) PCT Pub. No.: WO2020/228264
PCT Pub. Date: Nov. 19, 2020

(65) Prior Publication Data
US 2020/0362185 A1 Nov. 19, 2020

(51) Int. Cl.
*C09D 11/50* (2014.01)
*C09D 11/38* (2014.01)
(Continued)

(52) U.S. Cl.
CPC .............. *C09D 11/50* (2013.01); *C09D 11/03* (2013.01); *C09D 11/38* (2013.01); *C09K 11/06* (2013.01);
(Continued)

(58) Field of Classification Search
CPC ........ H01L 51/005; C09K 11/06; C09D 11/50
See application file for complete search history.

(56) References Cited

U.S. PATENT DOCUMENTS

2011/0108824 A1 5/2011 Heun et al.
2019/0382605 A1 12/2019 Shi

FOREIGN PATENT DOCUMENTS

CN 102076729 A 5/2011
CN 107706318 A 2/2018
(Continued)

OTHER PUBLICATIONS

New display technology 2012-2013 Chemistry Development Report Functional materials for printing and packaging Chemistry A European Jpurnal Low-Temperature Cross-Linkable Small Molecules for Fully Solution-Processed OLEDs.

*Primary Examiner* — Anthony Ho
(74) *Attorney, Agent, or Firm* — Mark M. Friedman

(57) ABSTRACT

The present disclosure relates to an inkjet printing ink and application thereof. In one aspect, the inkjet printing ink includes a crosslinking type organic host material, an organic doped luminescent material, a surface tension modifier, a viscosity modifier, and a solvent. On the other aspect, the present disclosure provides printing the inkjet printing ink on a substrate of a display panel to be prepared, performing drying process, and performing baking process at 120° C. to form an organic light emitting layer. Therefore, avoiding the problem of mutual dissolution of the organic light emitting layer and the electron transport layer when the electron transport layer is printed on the organic light emitting layer, avoiding damage to the organic light emitting layer, realize an inkjet printing process of the organic electron transport layer, thereby reducing the cost of manufacturing.

10 Claims, 1 Drawing Sheet

(51) Int. Cl.
*C09D 11/03* (2014.01)
*H01L 51/00* (2006.01)
*C09K 11/06* (2006.01)
H01L 51/56 (2006.01)
H01L 51/50 (2006.01)

(52) U.S. Cl.
CPC ...... *H01L 51/0067* (2013.01); *H01L 51/0072* (2013.01); *H01L 51/0085* (2013.01); *C09K 2211/1029* (2013.01); *C09K 2211/185* (2013.01); *H01L 51/0005* (2013.01); *H01L 51/0007* (2013.01); *H01L 51/0028* (2013.01); *H01L 51/5016* (2013.01); *H01L 51/56* (2013.01)

(56) References Cited

FOREIGN PATENT DOCUMENTS

| | | |
|---|---|---|
| CN | 110157241 A | 8/2019 |
| WO | 2017052308 A2 | 3/2017 |

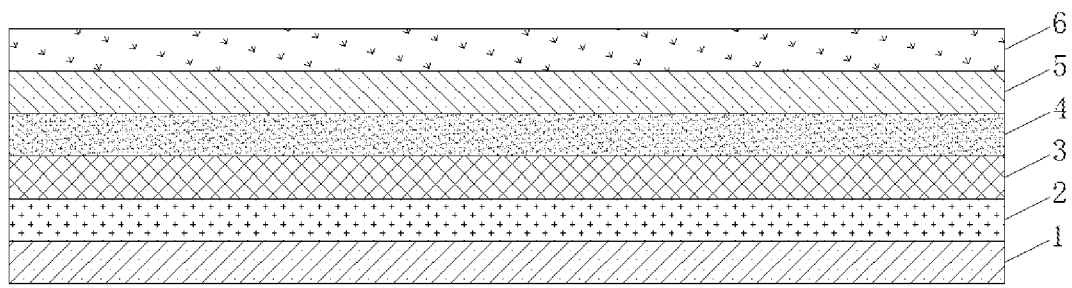

INKJET PRINTING INK AND APPLICATION THEREOF

FIELD OF INVENTION

The present disclosure relates to the field of display technologies, and more particularly to an inkjet printing ink and application method thereof.

BACKGROUND OF INVENTION

Display devices can convert the data of a computer to display into various characters, numbers, symbols or intuitive image. By inputting commands or data into the computer through an input tool such as a keyboard, display content can be added, modified, and transformed by the hardware and software of the system at any time. The display device is classified into a plasma, a liquid crystal, a light emitting diode, and a cathode ray tube depending on the display unit.

Cathode ray tube (CRT) displays operate by heating a filament after energization, exciting the cathode, and emitting the electron flow. Accelerating the electron flow by the internal metal layer with high voltage, focusing the electron flow by the lens to form a very fine electron beam, which strikes a phosphor screen and emits light after being subjected to high-speed impact.

Liquid crystal display (LCD). At present, the mainstream LCD is thin film transistor liquid crystal display (TFT-LCD), which derives from the development of the original liquid crystal display technology. The principle of the LCD is completely different from that of CRT. The LCD is constructed by placing a liquid crystal cell in two parallel glass substrates, a thin film transistor (TFT) on the lower glass substrate, and a color filter (CF) on the upper glass substrate.

In TFT-LCD active liquid crystal display, each sub-pixel has a TFT whose gate is connected to a horizontal scanning line, whose drain is connected to a vertical data line, and whose source is connected to a pixel electrode. Applying enough voltage on the horizontal scanning line causes turning all the TFTs on the horizontal scanning line on. At this time, the pixel electrodes on the horizontal scanning line are connected to the vertical data line, thereby inputting a voltage of display signal into the pixel, and controlling the direction of rotation of the liquid crystal molecules by the signal and voltage of the TFT, thereby controlling the emission of the polarized light of each pixel to achieve the purpose of display. Each pixel of the TFT liquid crystal is provided with a semiconductor switch to completely control each single pixel, and the liquid crystal material is sandwiched between a TFT glass layer and a color filter layer, by changing the voltage value of the stimulating liquid crystal, controlling the direction of rotation of the liquid crystal molecules, thereby controlling whether the polarized light of each pixel is emitted or not to achieve the purpose of display, and controlling the intensity and color of the last appearing light.

Organic light emitting diode (OLED) devices also known as organic electro-laser display device, organic light emitting semiconductor. The basic structure of an OLED includes a positive electrode of electricity connected to a thin and transparent indium tin oxide (ITO) having semiconductor characteristics and another added metal-faced cathode, packaged into a sandwich-like structure. The entire structure of layers includes a hole transport layer (HTL), an illuminating layer (EL), and an electron transport layer (ETL). When the power is supplied to an appropriate voltage, the positive hole and the surface cathode charge are combined in the illuminating layer, and by the Coulomb force, the excitons (electron-hole pairs) in an excited state are combined at a certain probability, and the excited state is unstable in the normal environment. The excitons in the excited state recombine and transfer energy to the luminescent material, causing it to transform from the ground state to the excited state, and through the process of radiation relaxation, the excited state energy generates photons, releases light energy and generates light, and generates three primary colors of red, green and blue RGB according to different formulas.

First, the characteristics of the OLED are self-illuminating, unlike the thin film transistor-liquid crystal display (TFT-LCD), which requires a backlight; therefore, the visibility and brightness are high. Second, OLED has advantages of low voltage demand, high power saving efficiency, fast response, lightweight, thin thickness, simple structure, low cost, wide viewing angle, almost infinite contrast, low power consumption, and high reaction speed. It is one of the most important display technologies today, gradually replacing TFT-LCD, and expected to become the next generation mainstream display technology after LCD.

After the organic functional material is configured into ink of inkjet printing OLED technology, the inkjet printing method can accurately control the ink to drop into the pixel pit, realizing the maximum utilization of the material, because high vacuum evaporation equipment and fine metal are not required, and the reticle achieves high resolution. Therefore, the method effectively reduces costs, and has great advantages in manufacturing large-size OLED panels.

The structure of the inkjet printing OLED device is generally a multi-organic layer structure. A hole injection layer, a hole transport layer, and an organic light emitting layer are manufactured by layer-by-layer printing on an electrode, and then an electron transport layer and a cathode are manufactured by evaporation. Since using the solution coating method to organic material, there is a mutual solubility problem between the organic layer and the other layers, so that the printing manufacturing of the organic electron transport layer cannot be effectively realized. Currently, most of the organic light emitting layer and material of the electron transport layer can be dissolved in the same solvent, so that when printing the electron transport layer, it is difficult to avoid solvent damage to the light emitting layer. Therefore, to realize the printing process of the organic electron transport layer, it is urgent to develop a crosslinking organic light emitting layer to solve the above problems.

SUMMARY OF INVENTION

An object of the present disclosure is to provide an ink jet printing ink and an application method thereof, which can solve the problems of damage to an organic light emitting layer when an electron transport layer is printed on the organic light emitting layer.

To solve the above problems, an embodiment of the present disclosure provides an inkjet printing ink, including:

a crosslinking type organic host material having a crosslinking temperature in the range of 80 to 120° C. and a weight percentage ranging from 5% to 30%;

an organic doped luminescent material having a high glass transition temperature more than 120° C. and a weight percentage ranging from 0.1% to 5%;

a surface tension modifier having a weight percentage ranging from 0.1% to 5%;

a viscosity modifier having a weight percentage ranging from 0.1% to 5%; and a solvent having a weight percentage ranging from 55% to 94.7%.

Furthermore, the crosslinking type organic host material includes a crosslinking group, the crosslinking group is selected from the group consisting of a vinyl group, an epoxy group, and an uracil group.

Furthermore, the organic doped luminescent material is selected from the group consisting of a fluorescent material, a phosphorescent material, and a thermally activated delayed fluorescent material.

Furthermore, the surface tension modifier is selected from the group consisting of a cosolvent, a surfactant, and a small molecule compound that adjusts surface tension; and the small molecule compound that adjusts surface tension is selected from the group consisting of an imidazole and derivatives of the imidazole, a phenol, and a hydroquinone.

Furthermore, the viscosity modifier is selected from the group consisting of an alcohol, an ether, an ester, a phenol, and an amine.

Furthermore, the solvent is selected from the group consisting of a toluene, a xylene, a chlorobenzene, an o-dichlorobenzene, a cyclohexylbenzene, and a benzoate.

Furthermore, the crosslinking type organic host material is u-CzTP, which has a chemical structural formula as follows:

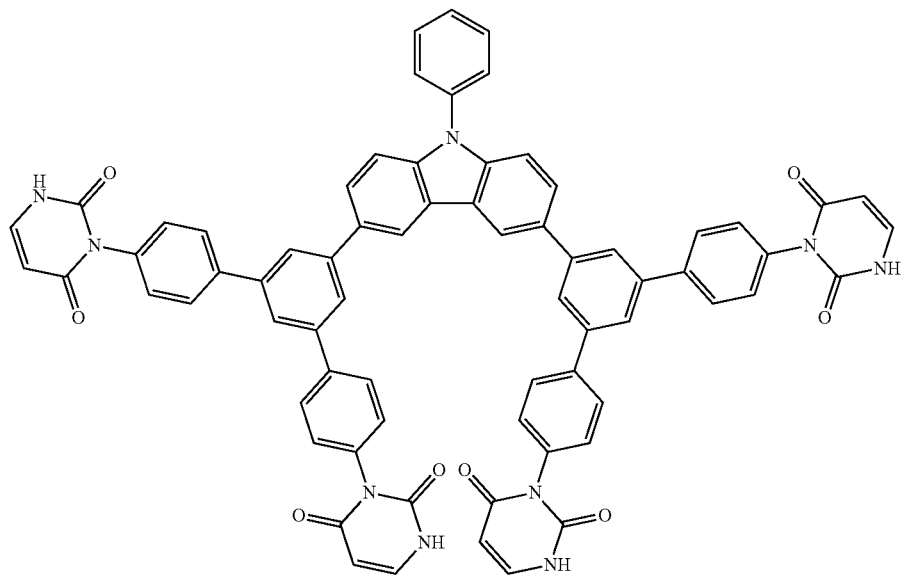 [SMILES: O=c1cc[nH]c(=O)n1-c1ccc(-c2cc(-c3ccc(-n4c(=O)cc[nH]c4=O)cc3)cc(-c3ccc4c(c3)c3cc(-c5cc(-c6ccc(-n7c(=O)cc[nH]c7=O)cc6)cc(-c6ccc(-n7c(=O)cc[nH]c7=O)cc6)c5)ccc3n4-c3ccccc3)c2)cc1]

the organic doped luminescent material is Ir(mppy)3, which has a chemical structural formula as follows:

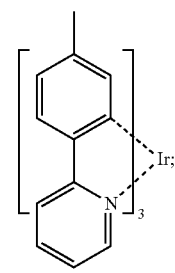

and a mixing ratio of the u-CzTP to Ir(mppy)3 ranges from 1:(0.01 to 0.05).

Furthermore, the solvent is a mixed solvent of o-xylene and cyclohexylbenzene in a mixing ratio ranging from 3:(1 to 10).

Furthermore, the inkjet printing ink has a concentration ranging from 5 to 15 mg/mL, a surface tension ranging from 20 to 60 mN/m, and a viscosity ranging from 1 to 100 mPa·s.

An embodiment of the present disclosure further provides an application method of an inkjet printing ink, including: printing the inkjet printing ink on a substrate of a display panel to be prepared, performing drying process, and performing baking process at 120° C. to form an organic light emitting layer.

The present disclosure relates to an inkjet printing ink and application thereof. In one aspect, the inkjet printing ink includes a crosslinking type organic host material, an organic doped luminescent material, a surface tension modifier, a viscosity modifier, and a solvent. On the other aspect, the present disclosure provides printing the inkjet printing ink on a substrate of a display panel to be prepared, performing drying process, and performing baking process at 120° C. to form an organic light emitting layer. Therefore, avoiding the problem of mutual dissolution of the organic light emitting layer and the electron transport layer when the electron transport layer is printed on the organic light emitting layer, avoiding damage to the organic light emitting layer, realize an inkjet printing process of the organic electron transport layer, thereby reducing the cost of manufacturing.

DESCRIPTION OF FIGURES

In order to more clearly illustrate the technical solutions in the embodiments of the present disclosure, the figures used in the description of the embodiments will be briefly described below. It is obvious that the figures in the following description are only some embodiments of the present disclosure. Other figures can also be obtained from those skilled in the art based on these figures without any inventive steps.

FIG. 1 is a schematic structural diagram of an OLED display of the present disclosure.

DETAILED DESCRIPTION OF PREFERRED EMBODIMENTS

The preferred embodiments of the present disclosure are described in detail below with reference to the accompanying figures, to fully described the technical contents of the present disclosure to those skilled in the art, to prove the present disclosure can be practiced, to make the technical content of the present disclosure clearer, and to make it easier for those skilled in the art to understand how to implement the present disclosure. However, the present disclosure can be embodied in many different forms and embodiments, the scope of the present disclosure is not limited to the embodiments described herein.

The directional terms mentioned in the present disclosure, such as "upper", "lower", "before", "after", "left", "right", "inside", "outside", "side", etc., are only attached the directional terms used in the figures used to explain and describe the present disclosure, and are not intended to limit the scope of the present disclosure.

In the figures, the same structural components denoted by the same reference numerals, and the similar structural or functional components denoted by the similar reference numerals. Moreover, for ease understanding and description, the size and thickness of each component shown in the figures are shown in arbitrarily, not means to limit the size and thickness of each component of the present disclosure.

When a component is described as "on" another component, the component can be disposed directly on the other component, there can also be the component disposed on the intermediate component disposed on another component. When a component is described as "mounted" or "connected" another component, it can be understood as "mounted" or "connected" directly, or "mounted" or "connected" through the intermediate component to another component.

Embodiment 1

This embodiment provides an inkjet printing ink including: a crosslinking type organic host material, an organic doped luminescent material, a surface tension modifier, a viscosity modifier, and a solvent.

The crosslinking type organic host material having a crosslinking temperature in the range of 80 to 120° C. and a weight percentage ranging from 5% to 30%, wherein the crosslinking type organic host material contains a crosslinking group, the crosslinking group is selected from the group consisting of a vinyl group, an epoxy group, and an uracil group, and the chemical structural formula of the vinyl group, the epoxy group, and the uracil group are as follows:

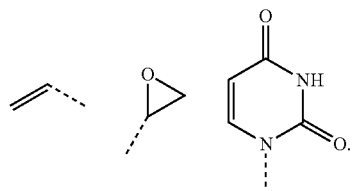

The organic doped luminescent material having a high glass transition temperature greater than 120° C. and a weight percentage ranging from 0.1% to 5%, wherein the organic doped luminescent material is selected from the group consisting of the fluorescent material, the phosphorescent material, and the thermally activated delayed fluorescent material.

The surface tension modifier having a weight percentage ranging from 0.1% to 5%, wherein the surface tension modifier is selected from the group consisting of a cosolvent, a surfactant, and a small molecule compound that adjusts surface tension; and the small molecule compound that adjusts surface tension is selected from the group consisting of an imidazole and derivatives of the imidazole, a phenol, and a hydroquinone.

The viscosity modifier having a weight percentage ranging from 0.1% to 5%, wherein the viscosity modifier is selected from the group consisting of an alcohol, an ether, an ester, a phenol, and an amine.

The solvent having a weight percentage ranging from 55% to 94.7%, wherein the solvent is selected from the group consisting of a toluene, a xylene, a chlorobenzene, an o-dichlorobenzene, a cyclohexylbenzene, and a benzoate.

the crosslinking type organic host material is u-CzTP, which has a chemical structural formula as follows:

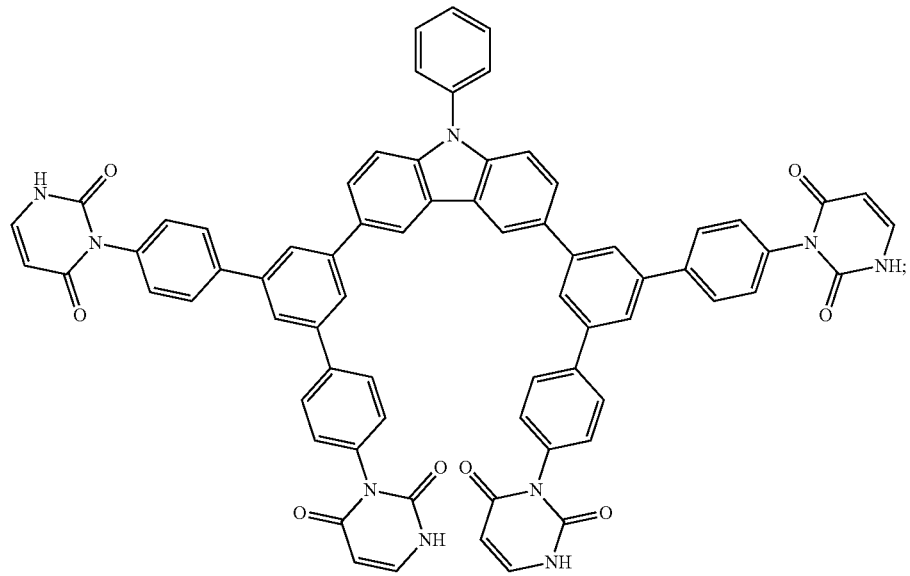 [SMILES: O=c1cc[nH]c(=O)n1-c1ccc(-c2cc(-c3ccc(-n4c(=O)cc[nH]c4=O)cc3)cc(-c3ccc4c(c3)c3cc(-c5cc(-c6ccc(-n7c(=O)cc[nH]c7=O)cc6)cc(-c6ccc(-n7c(=O)cc[nH]c7=O)cc6)c5)ccc3n4-c3ccccc3)c2)cc1]

the organic doped luminescent material is Ir(mppy)3, which has a chemical structural formula as follows:

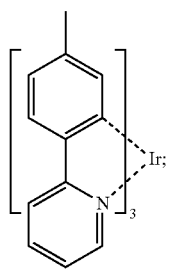

and specifically,
a mixing ratio of the u-CzTP to Ir(mppy)3 ranges from 1:(0.01 to 0.05).

the solvent is a mixed solvent of o-xylene and cyclohexylbenzene in a mixing ratio ranging from 3:(1 to 10).

The inkjet printing ink concentration in this embodiment ranges from 5 to 15 mg/mL, the surface tension ranges from 20 to 60 mN/m, and the viscosity ranges from 1 to 100 mPa·s.

Embodiment 2

The present embodiment provides an application of the inkjet printing ink, including: printing the inkjet printing ink on a substrate of a display panel to be prepared, performing vacuum drying process, and performing baking process at 120° C. to form an organic light emitting layer 4, wherein the inkjet printing ink is used in a manufacturing process of manufacturing the organic light emitting layer in a display panel. Therefore, avoiding the problem of mutual dissolution of the organic light emitting layer and the electron transport layer when the electron transport layer is printed on the organic light emitting layer, avoiding damage to the organic light emitting layer, realize an inkjet printing process of the organic electron transport layer, thereby reducing the cost of manufacturing.

Embodiment 3

As shown in FIG. 1, this embodiment further provides an OLED display comprising: an anode 1, a hole injection layer 2, a hole transport layer 3, an organic light emitting layer 4, an electron transport layer 5, and a cathode 6. The hole injection layer 2 is disposed on the anode 1, the hole transport layer 3 is disposed on the hole injection layer 2, the organic light emitting layer 4 is disposed on the hole transport layer 3, the organic light emitting layer 3 is disposed on the organic light emitting layer 4, wherein the organic light emitting layer 4 is manufactured by the above-described manufacturing method, the electron transport layer 5 is disposed on the organic light emitting layer 4, and the cathode 6 is disposed on the electron transport layer 5.

The anode 1 may be composed of ITO (indium tin oxide), and the anode 1 made of ITO having good light transmittance, wherein the hole transport layer 3 controls the transport of holes, thereby controlling the recombination of electrons with holes in the organic light emitting layer 4, improving the luminous efficiency. The electron transport layer 5 controls the transmission of electrons, thereby controlling the recombination of electrons with holes in the organic light emitting layer 4, thereby improving the luminous efficiency.

The ink jet printing ink and its application and the OLED display provided by the present disclosure are described in detail above. It is understood that the exemplary embodiments described herein are to be considered as illustrative only, and are not intended to limit the invention. It is understood that the exemplary embodiments described herein are to be considered as illustrative only, and are not intended to limit the present disclosure. Descriptions of features or aspects in each exemplary embodiment should generally be considered as suitable features or aspects in other exemplary embodiments. While the present disclosure has been described with reference to the preferred embodiments thereof, various modifications and changes can be made by those skilled in the art. The present disclosure is intended to cover such modifications and variations within the scope of the appended claims, and any modifications, equivalents, and modifications within the spirit and scope of the present disclosure are intended to be included within the scope of the present disclosure.

What is claimed is:

1. An inkjet printing ink, comprising:
a crosslinking type organic host material having a crosslinking temperature in the range of 80 to 120° C. and a weight percentage ranging from 5% to 30%;
an organic doped luminescent material having a high glass transition temperature greater than 120° C. and a weight percentage ranging from 0.1% to 5%;
a surface tension modifier having a weight percentage ranging from 0.1% to 5%;
a viscosity modifier having a weight percentage ranging from 0.1% to 5%; and
a solvent having a weight percentage ranging from 55% to 94.7%.

2. The inkjet printing ink as claimed in claim 1, wherein the crosslinking type organic host material comprises a crosslinking group, the crosslinking group is selected from the group consisting of a vinyl group, an epoxy group, and an uracil group.

3. The inkjet printing ink as claimed in claim 1, wherein the organic doped luminescent material is selected from the group consisting of a fluorescent material, a phosphorescent material, and a thermally activated delayed fluorescent material.

4. The inkjet printing ink as claimed in claim 1, wherein the surface tension modifier is selected from the group consisting of a cosolvent, a surfactant, and a small molecule compound that adjusts surface tension; and
the small molecule compound that adjusts surface tension is selected from the group consisting of an imidazole and derivatives of the imidazole, a phenol, and a hydroquinone.

5. The inkjet printing ink as claimed in claim 1, wherein the viscosity modifier is selected from the group consisting of an alcohol, an ether, an ester, a phenol, and an amine.

6. The inkjet printing ink as claimed in claim 1, wherein the solvent is selected from the group consisting of a toluene, a xylene, a chlorobenzene, an o-dichlorobenzene, a cyclohexylbenzene, and a benzoate.

7. The inkjet printing ink as claimed in claim 1, wherein the crosslinking type organic host material is u-CzTP, which has a chemical structural formula as follows:

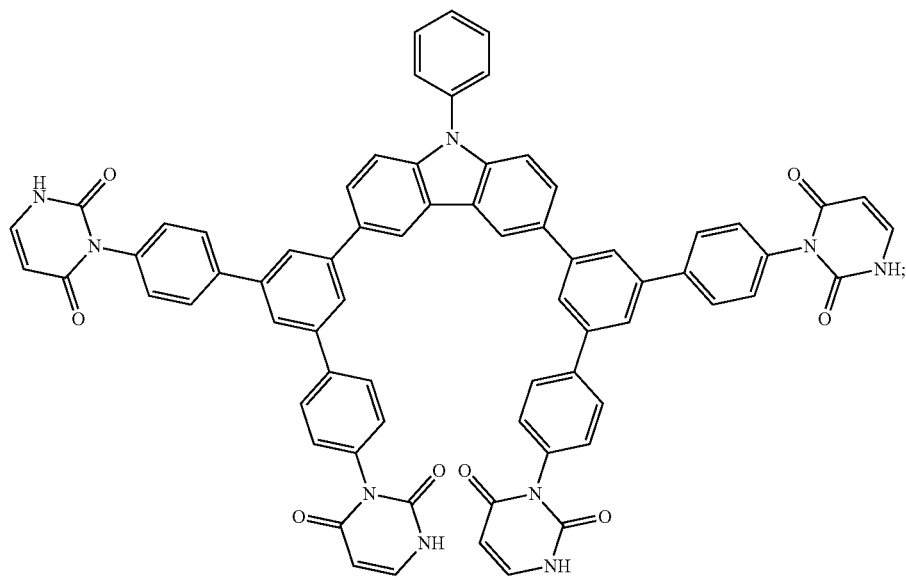 [SMILES: O=c1cc[nH]c(=O)n1-c1ccc(-c2cc(-c3ccc(-n4c(=O)cc[nH]c4=O)cc3)cc(-c3ccc4c(c3)c3cc(-c5cc(-c6ccc(-n7c(=O)cc[nH]c7=O)cc6)cc(-c6ccc(-n7c(=O)cc[nH]c7=O)cc6)c5)ccc3n4-c3ccccc3)c2)cc1]

the organic doped luminescent material is Ir(mppy)3, which has a chemical structural formula as follows:

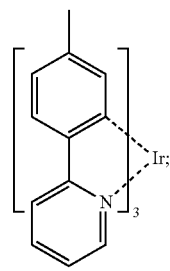

and
a mixing ratio of the u-CzTP to the Ir(mppy)3 ranges from 1:(0.01 to 0.05).

8. The inkjet printing as claimed in claim 1, wherein the solvent is a mixed solvent of o-xylene and cyclohexylbenzene in a mixing ratio ranging from 3:(1 to 10).

9. The inkjet printing ink as claimed in claim 1, wherein the inkjet printing ink has a concentration ranging from 5 to 15 mg/mL, a surface tension ranging from 20 to 60 mN/m, and a viscosity ranging from 1 to 100 mPa·s.

10. An application method of an inkjet printing ink as claimed in claim 1, comprising:
   printing the inkjet printing ink on a substrate of a display panel to be prepared, performing drying process, and performing baking process at 120° C. to form an organic light emitting layer;
   wherein the inkjet printing ink is used in a manufacturing process of manufacturing the organic light emitting layer in a display panel, the inkjet printing ink comprising:
   a crosslinking type organic host material having a crosslinking temperature in the range of 80 to 120° C., and a weight percentage ranging from 5% to 30%;
   an organic doped luminescent material having a high glass transition temperature more than 120° C., and a weight percentage ranging from 0.1% to 5%;
   a surface tension modifier having a weight percentage ranging from 0.1% to 5%;
   a viscosity modifier having a weight percentage ranging from 0.1% to 5%; and
   a solvent having weight percentage ranging from 55% to 94.7%.

* * * * *